United States Patent
Kiyomi et al.

(10) Patent No.: US 8,142,566 B2
(45) Date of Patent: Mar. 27, 2012

(54) METHOD FOR PRODUCING GA-CONTAINING NITRIDE SEMICONDUCTOR SINGLE CRYSTAL OF $B_XAl_YGa_ZIn_{1-X-Y-Z}N_SP_TAs_{1-S-T}$ ($0 \leq X \leq 1$, $0 \leq Y < 1$, $0 < Z \leq 1$, $0 < S \leq 1$ AND $0 \leq T < 1$) ON A SUBSTRATE

(75) Inventors: Kazumasa Kiyomi, Ibaraki (JP); Hirobumi Nagaoka, Ibaraki (JP); Hirotaka Oota, Ibaraki (JP); Isao Fujimura, Ibaraki (JP)

(73) Assignee: Mitsubishi Chemical Corporation, Tokyo (JP)

( * ) Notice: Subject to any disclaimer, the term of this patent is extended or adjusted under 35 U.S.C. 154(b) by 607 days.

(21) Appl. No.: 11/659,420

(22) PCT Filed: Aug. 5, 2005

(86) PCT No.: PCT/JP2005/014395
§ 371 (c)(1), (2), (4) Date: Oct. 25, 2007

(87) PCT Pub. No.: WO2006/013957
PCT Pub. Date: Feb. 9, 2006

(65) Prior Publication Data
US 2008/0308812 A1 Dec. 18, 2008

(30) Foreign Application Priority Data

Aug. 6, 2004 (JP) .................................. 2004-230212
Mar. 23, 2005 (JP) .................................. 2005-84907

(51) Int. Cl.
*H01L 21/205* (2006.01)
*H01L 29/20* (2006.01)

(52) U.S. Cl. ............... 117/93; 117/89; 117/97; 117/102
(58) Field of Classification Search ................. 438/479, 438/507, 478; 257/E21.108, E21.126; 117/85, 117/89, 93, 97, 101, 102
See application file for complete search history.

(56) References Cited

U.S. PATENT DOCUMENTS 5,042,043 A * 8/1991 Hatano et al. ............ 372/45.012
5,620,557 A     4/1997 Manabe et al.
5,770,887 A     6/1998 Tadatomo et al.
(Continued)

FOREIGN PATENT DOCUMENTS

JP         7-165498        6/1995
(Continued)

OTHER PUBLICATIONS

C. R. Miskys et al. Freestanding GaN-Substrates and Device, Phys. Stat. Sol. 0, No. 6, pp. 1627-1650 (2003).*
(Continued)

*Primary Examiner* — Anh Mai
(74) *Attorney, Agent, or Firm* — Oblon, Spivak, McClelland, Maier & Neustadt, L.L.P.

(57) ABSTRACT

A Ga-containing nitride semiconductor single crystal characterized in that (a) the maximum reflectance measured by irradiating the Ga-containing nitride semiconductor single crystal with light at a wavelength of 450 nm is 20% or less and the difference between the maximum reflectance and the minimum reflectance is within 10%, (b) the ratio of maximum value to minimum value (maximum value/minimum value) of the dislocation density measured by a cathode luminescence method is 10 or less, and/or (c) the lifetime measured by a time-resolved photoluminescence method is 95 ps or more.

9 Claims, 3 Drawing Sheets

U.S. PATENT DOCUMENTS

| | | | |
|---|---|---|---|
| 5,810,925 | A | 9/1998 | Tadatomo et al. |
| 5,993,542 | A * | 11/1999 | Yanashima et al. ............. 117/84 |
| 6,765,240 | B2 | 7/2004 | Tischler et al. |
| 7,097,920 | B2 | 8/2006 | Usui et al. |
| 2003/0027407 | A1 * | 2/2003 | Koike et al. ................... 438/478 |
| 2003/0183157 | A1 | 10/2003 | Usui et al. |
| 2004/0124435 | A1 | 7/2004 | D'Evelyn et al. |
| 2006/0054076 | A1 | 3/2006 | Dwilinski et al. |
| 2006/0191467 | A1 | 8/2006 | Usui et al. |

FOREIGN PATENT DOCUMENTS

| | | |
|---|---|---|
| JP | 7-202265 | 8/1995 |
| JP | 10-173288 | 6/1998 |
| JP | 11-251253 | 9/1999 |
| JP | 2000-288342 | 10/2000 |
| JP | 2002-237458 | 8/2002 |
| JP | 2003-209100 | 7/2003 |
| JP | 2003-277195 | 10/2003 |
| JP | 2005-236260 | 9/2005 |
| JP | 2006-8500 | 1/2006 |
| JP | 2006-24897 | 1/2006 |
| WO | WO 00/68470 | 11/2000 |
| WO | WO 03/098708 A1 | 11/2003 |
| WO | WO 2004/061923 A1 | 7/2004 |

OTHER PUBLICATIONS

Xueping Xu, et al. "Growth and Characterization of Low Defect GaN by Hydride Vapor Phase Epitaxy", Journal of Crystal Growth, vol. 246, 2002, pp. 223-229.

D. C. Reynolds, et al., "Strain variation with sample thickness in GaN grown by hydride vapor phase epitaxy", Journal of Applied Physics, vol. 88, No. 3, XP-002545001, Aug. 1, 2000, pp. 1460-1463.

Ho Ki Kwon, et al., "Observation of long photoluminescence decay times for high-quality GaN grown by metalorganic chemical vapor deposition", Applied Physics Letters, vol. 77, No. 16, XP-002545002, Oct. 16, 2000, pp. 2503-2505.

T. Izumi, et al., "Time-resolved photoluminescence spectroscopy in GaN-based semiconductors with micron spatial resoution", Journal of Luminescence, vol. 87-89, XP-002545003, 2000, pp. 1196-1198.

Office Action issued Jul. 26, 2011, in Japanese Patent Application No. 2005-227525 (with English-language Translation).

A. V. Sampath, et al; "Effect of Ga-rich growth conditions on the optical properties of GaN films grown by plasma-assisted molecular beam epitaxy"; J. Vac. Sci. Technol. B; Jun. 8, 2004; vol. 22; pp. 1487-1490.

* cited by examiner (a)

(b)

(a)

(b)

METHOD FOR PRODUCING GA-CONTAINING NITRIDE SEMICONDUCTOR SINGLE CRYSTAL OF $B_XAL_YGA_ZIN_{1-X-Y-Z}N_SP_TAS_{1-S-T}$ ($0 \leq X \leq 1$, $0 \leq Y<1$, $0<Z \leq 1$, $0<S \leq 1$ AND $0 \leq T<1$) ON A SUBSTRATE

TECHNICAL FIELD

The present invention relates to a Ga-containing nitride semiconductor single crystal with less crystal defects and good crystallinity, which is a single crystal suitably usable as a substrate of a semiconductor device, for example, a light-emitting device such as light-emitting diode and semiconductor laser, a chip or module using the light-emitting device, and an electronic device.

BACKGROUND ART

In recent years, a semiconductor device such as light-emitting device (e.g., semiconductor light-emitting element, light-emitting diode, semiconductor laser) and electronic device is increasingly demanded to realize high density and high resolution of optical recording or the like and for this purpose, a nitride semiconductor capable of emitting blue light is attracting attention. In particular, it is required to provide a nitride semiconductor substrate with less crystal defects and good crystallinity.

In order to grow such a good nitride semiconductor on an original substrate, the original substrate selected and used is preferably lattice-matched to the objective nitride semiconductor. However, in fact, an original substrate lattice-matching to the nitride semiconductor is difficult to obtain and at present, a nitride semiconductor is grown on an original substrate which is a dissimilar material to the nitride semiconductor but has sufficiently high heat resistance or chemical stability. For example, various techniques of growing a nitride semiconductor by using a relatively inexpensive sapphire or zinc oxide original substrate have been heretofore proposed.

For example, JP-A-7-165498 (the term "JP-A" as used herein means an "unexamined published Japanese patent application") and JP-A-7-202265 disclose a method of forming a buffer layer comprising zinc oxide on a sapphire original substrate, growing a nitride semiconductor thereon, and removing the buffer layer to obtain a nitride semiconductor. However, this method has a problem that since the buffer layer formed on a sapphire original substrate has bad quality, the nitride semiconductor formed thereon comes to have crystal defects as many as $10^8/cm^2$ or more and a good-quality nitride semiconductor is not obtained.

In order to overcome such a problem, JP-A-11-251253 proposes a method of forming an underlying layer on a sapphire original substrate, then forming a mask layer comprising $SiO_2$ or the like, thereby artificially applying a surface processing, and further growing thereon a nitride semiconductor. According to this method, a nitride semiconductor having less crystal defects as compared with the case of growing a nitride semiconductor on a buffer layer comprising zinc oxide can be obtained. However, the nitride semiconductor obtained by this method has a problem that a pattern attributable to the artificial surface processing applied to the original substrate is formed therein. For example, when a striped surface processing is applied to the original substrate, a striped pattern is formed in the nitride semiconductor grown thereon. Therefore, a portion with good crystallinity must be selected and used out of the produced nitride semiconductor and this is inconvenient.

DISCLOSURE OF THE INVENTION

The present invention has been made to solve those problems and an object of the present invention is to provide a Ga-containing nitride semiconductor single crystal and a nitride semiconductor substrate, which are ensuring less crystal defects and high quality. Another object of the present invention is to provide a light-emitting device or an electronic device with excellent performance by using the high-quality nitride semiconductor substrate having less crystal defects.

As a result of intensive investigations, the present inventors have succeeded in providing a high-quality Ga-containing nitride semiconductor single crystal which could not be obtained by a conventional method.

That is, the gist of the present invention is as follows.

(1) A Ga-containing nitride semiconductor single crystal having a composition represented by the formula: $B_xAl_yGa_zIn_{1-x-y-z}N_sP_tAs_{1-s-t}$ (wherein $0 \leq x \leq 1$, $0 \leq y<1$, $0<z \leq 1$, $0<s \leq 1$ and $0 \leq t<1$), and satisfying at least one of the following (a), (b) and (c):

(a) the minimum reflectance measured by irradiating the Ga-containing nitride semiconductor single crystal with light at a wavelength of 450 nm is 20% or less and the difference between the maximum reflectance and the minimum reflectance is within 10%, (b) the ratio of maximum value to minimum value (maximum value/minimum value) of the dislocation density measured by a cathode luminescence method is 10 or less, and (c) the lifetime measured by a time-resolved photo-luminescence method is 95 μs or more.

(2) The Ga-containing nitride semiconductor single crystal as described in (1), wherein a defect-concentrated region defined in (d) below is not present in the crystal:

(d) a region where the number of lattice defects is $10^{10}/cm^2$ or more, the length is 2 μm or more, the width is 2 μm or more and the height is 2 μm or more.

(3) The Ga-containing nitride semiconductor single crystal as described in (1) or (2), wherein the size is 400 mm² or more.

(4) The Ga-containing nitride semiconductor single crystal as described in any one of (1) to (3), wherein the thickness is 350 μm or more.

(5) The Ga-containing nitride semiconductor single crystal as described in any one of (1) to (4), wherein the number of lattice defects contained in the crystal is less than $10^8/cm^2$.

(6) The Ga-containing nitride semiconductor single crystal as described in any one of (1) to (5), which is a hexagonal crystal or a cubic crystal.

(7) The Ga-containing nitride semiconductor single crystal as described in any one of (1) to (6), wherein the composition is GaN.

The Ga-containing nitride semiconductor single crystal of the present invention is free from a pattern attributable to the artificial surface processing of the underlying substrate and has lattice defects as little as less than $10^8/cm^2$. The Ga-containing nitride semiconductor crystal of the present invention preferably has no distribution in the reflectance and/or light scattering and is free from a portion in which defects are concentrated. The fluctuation width of the dislocation density per unit area depending on the position of the crystal is preferably within one digit. Furthermore, striped or dot-like defects are preferably not present in the crystal. The present invention also provides a Ga-containing nitride semiconductor single crystal comprising a nitride semiconductor crystal having neither streaks nor islands in the inside.

(8) A method for producing the Ga-containing nitride semiconductor single crystal described in any one of (1) to (7), comprising growing a Ga-containing nitride semiconductor single crystal on an original substrate.

(9) The method for producing a Ga-containing nitride semiconductor single crystal as described in (8), wherein the original substrate is a single crystal and the lattice constant thereof is from 0.30 to 0.36 nm in the a-axis direction and from 0.48 to 0.58 nm in the c-axis direction.

(10) The method for producing a Ga-containing nitride semiconductor single crystal as described in (8) or (9), wherein the bandgap energy of the original substrate is from 2.0 to 6.5 eV.

(11) The method for producing a Ga-containing nitride semiconductor single crystal as described in (8) or (9), wherein the compound semiconductor original substrate has a composition represented by the formula: $B_x Al_y Ga_z In_{1-x'-y'-z'} N_s P_t As_{1-s'-t'}$ (wherein $0 \leq x' \leq 1$, $0 \leq y' < 1$, $0 < z' \leq 1$, $0 < s' \leq 1$ and $0 \leq t' < 1$).

(12) The method for producing a Ga-containing nitride semiconductor single crystal as described in (8), wherein the original substrate is sapphire, zinc oxide or gallium nitride.

(13) The method for producing a Ga-containing nitride semiconductor single crystal as described in any one of (8) to (12), wherein the Ga-containing nitride semiconductor single crystal is grown on an initial nitride semiconductor layer formed on the original substrate.

(14) The method for producing a Ga-containing nitride semiconductor single crystal as described in (13) or (14), wherein a first Ga-containing nitride semiconductor single crystal is grown on the initial nitride semiconductor layer formed on the original substrate and a second Ga-containing nitride semiconductor single crystal layer is further grown thereon.

(15) The method for producing a Ga-containing nitride semiconductor single crystal as described in (13), wherein the thickness of the initial nitride semiconductor layer is from 1 to 200 μm.

(16) The method for producing a Ga-containing nitride semiconductor single crystal as described in (13) or (14), wherein the initial nitride semiconductor layer is gallium nitride.

(17) The method for producing a Ga-containing nitride semiconductor single crystal as described in any one of (8) to (15), wherein the surface roughness Ra of the original substrate and/or the initial nitride semiconductor layer formed on the original substrate is 1 nm or less.

(18) The method for producing a Ga-containing nitride semiconductor single crystal as described in any one of (8) to (16), wherein the Ga-containing nitride semiconductor single crystal is grown by the hydride vapor phase epitaxy method.

(19) The method for producing a Ga-containing nitride semiconductor single crystal as described in any one of (8) to (17), wherein an ammonium chloride or ammonium chloride-containing gas produced as a by-product during the growth of the Ga-containing nitride semiconductor single crystal is discharged while keeping it at a temperature of 400° C. or more.

(20) A substrate for a semiconductor device, comprising the Ga-containing nitride semiconductor single crystal described in any one of (1) to (7).

(21) A light-emitting device using the substrate for a semiconductor device described in (19).

(22) An electronic device using the substrate for a semiconductor device described in (19).

The Ga-containing nitride semiconductor single crystal of the present invention is free from a pattern or defect attributable to the artificial surface processing of the underlying substrate and therefore, when used as a substrate for a semiconductor device, need not be cut out selecting a region which avoids the pattern or defect. Also, the Ga-containing semiconductor single crystal of the present invention is a high-quality crystal with less crystal defects and therefore, can be effectively used as a high-performance substrate for a semiconductor device in various application fields. Furthermore, the light-emitting device and the electronic device each using this nitride semiconductor substrate are easily produced and have high quality.

BEST MODE FOR CARRYING OUT THE INVENTION

Figure 1:
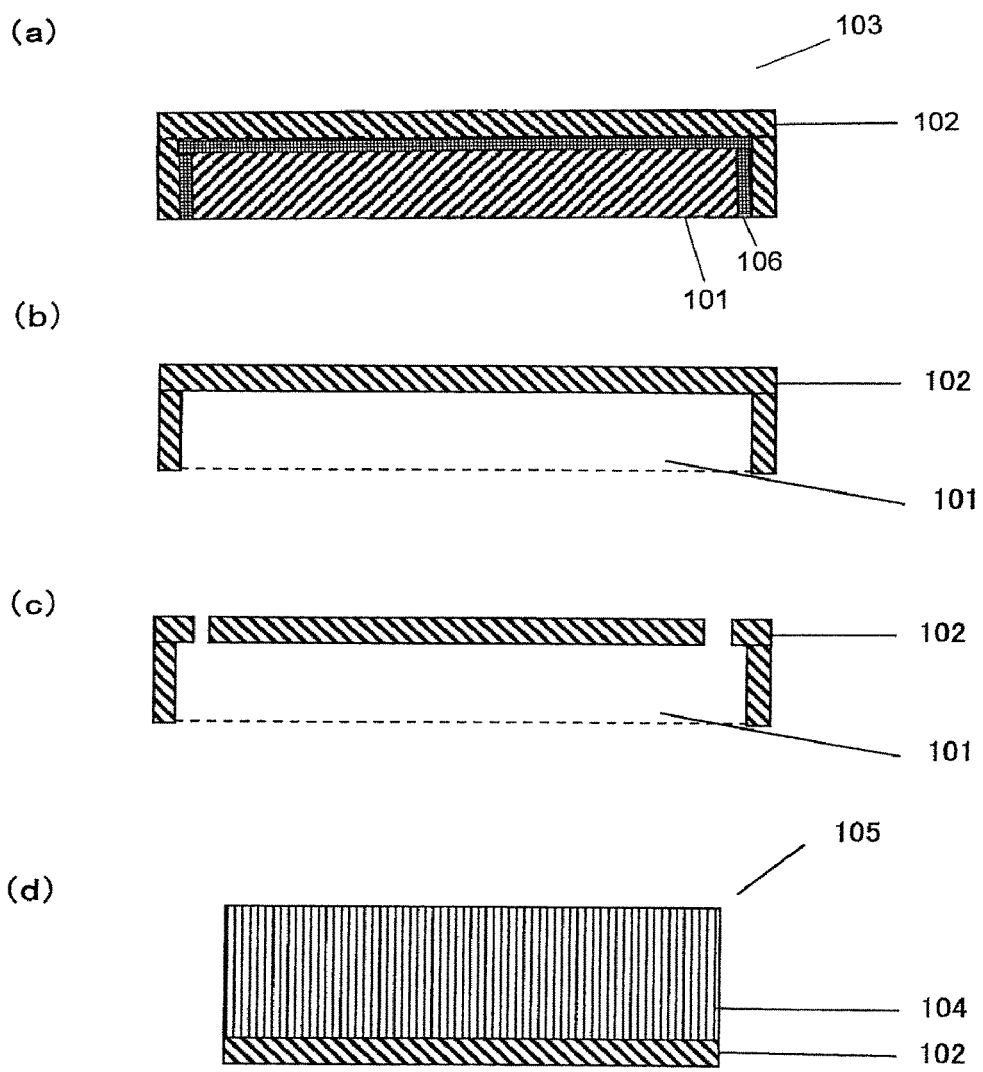
FIG. 1 is a schematic explanatory view showing the outline of production steps in Example 1; in the figure, 101 is a zinc oxide original substrate, 102 is a first GaN layer, 103 is an underlying layer, 104 is a second GaN layer and 105 is a GaN single crystal.

The Ga-containing nitride semiconductor single crystal of the invention and its utilization mode are described in detail below. In the following, the constitutional requirements are sometimes described based on a representative embodiment of the present invention, but the present invention is not limited to such an embodiment. In the present invention, the numerical value range expressed by using a word "to" means a range including the numerical values before and after the word "to" as a lower limit value and an upper limit value, respectively.

[Ga-Containing Nitride Semiconductor Single Crystal and Substrate]

The Ga-containing nitride semiconductor single crystal and the Ga-containing nitride semiconductor single crystal substrate using it of the present invention are free from a pattern attributable to the artificial surface processing of the underlying substrate and have lattice defects as little as less than $10^8/cm^2$. The "free from a pattern attributable to the artificial surface processing of the underlying substrate" as used in the present invention means that a pattern formed as a result of artificial application of a pattern (unevenness) to the surface of an underlying substrate used at the time of growing a Ga-containing nitride semiconductor single crystal is not present in the Ga-containing nitride semiconductor single crystal. When a Ga-containing nitride semiconductor single crystal is grown according to a conventional method on an underlying substrate in which an artificial processing is applied to the surface, a mark of the processing pattern remains in the crystal. For example, when a Ga-containing nitride semiconductor single crystal is grown on an underlying substrate on the surface of which a striped or dot-like mask pattern is formed, defects in the same cycle as the pattern remain in the crystal. Such a pattern attributable to the surface pattern of the underlying substrate is not present in the Ga-containing nitride semiconductor single crystal and the nitride semiconductor substrate using it of the present invention. The "underlying substrate" as used in the present invention means an entire substrate used at the time of growing the Ga-containing nitride semiconductor crystal of the present invention and is defined as a concept different from the original substrate such as sapphire and zinc oxide. The underlying substrate may comprise only an original substrate or may comprise an original substrate and an initial nitride semiconductor layer formed thereon.

Whether or not a pattern attributable to the artificial surface processing of the underlying substrate is present in the Ga-containing nitride semiconductor single crystal of the present invention can be judged by the observation through an optical microscope or a fluorescence microscope. The magnification at the observation is usually set to from 50-fold to 400-fold. For example, when a GaN crystal is grown by ELO (epitaxial lateral overgrowth) or the like on an underlying substrate subjected to patterning with a mask having a striped, dot-like or other pattern, the pattern by the mask can be observed from the surface by the surface observation through an optical microscope (Nomarsky). Furthermore, according to a fluorescence microscope, even the interface between the underlying substrate and the grown GaN crystal can be observed. A GaN crystal self-supporting independently of the underlying substrate may be observed by turning it over. Also, in the case of surface-polishing a self-supporting GaN crystal and observing scratches or pits thereof, these can be satisfactorily observed by an optical microscope.

Figure 2:
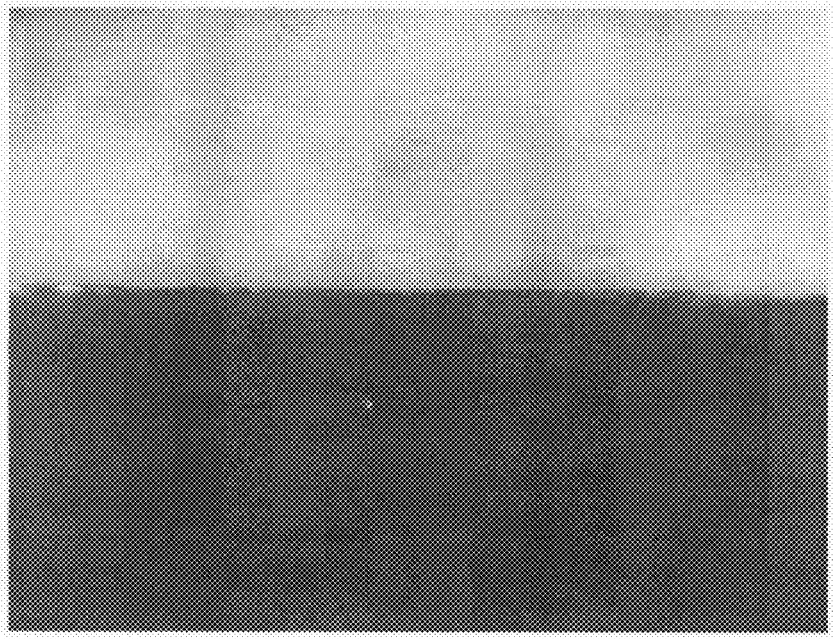
FIG. 2 is an optical photomicrograph of the GaN single crystal obtained in Example 1.
Figure 2:
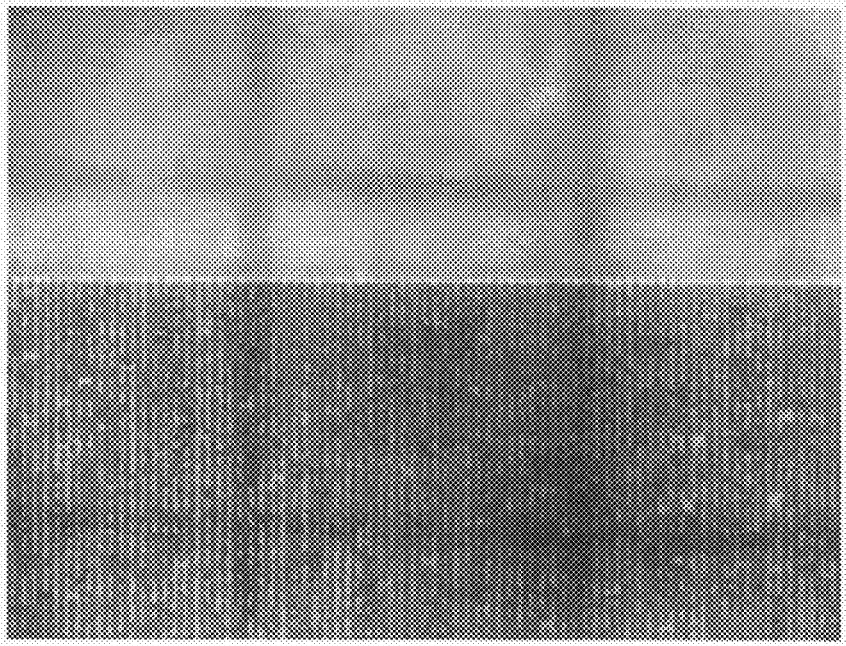
Figure 3:
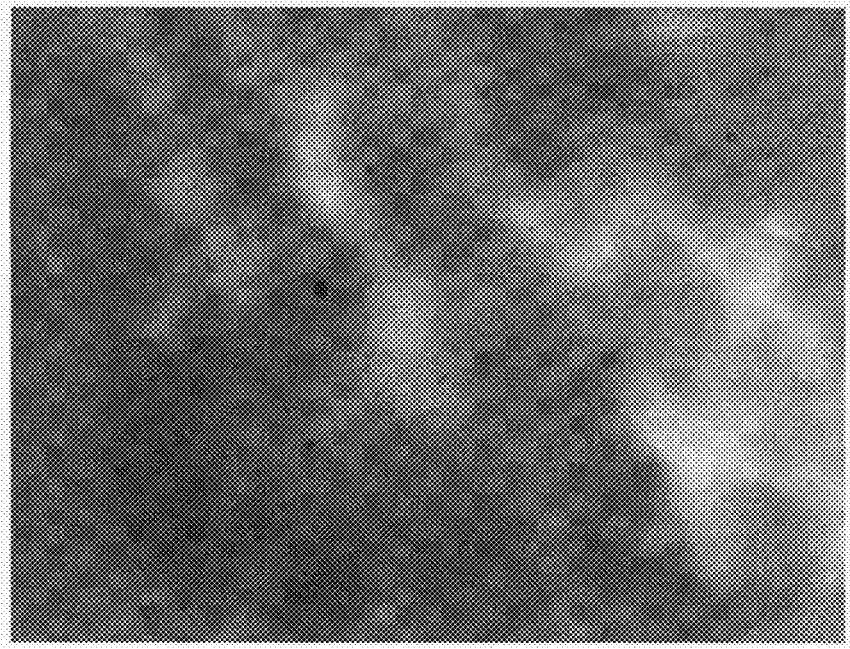
FIG. 3 is a fluorescence photomicrograph of the GaN single crystal obtained in Example 1.
Figure 3:
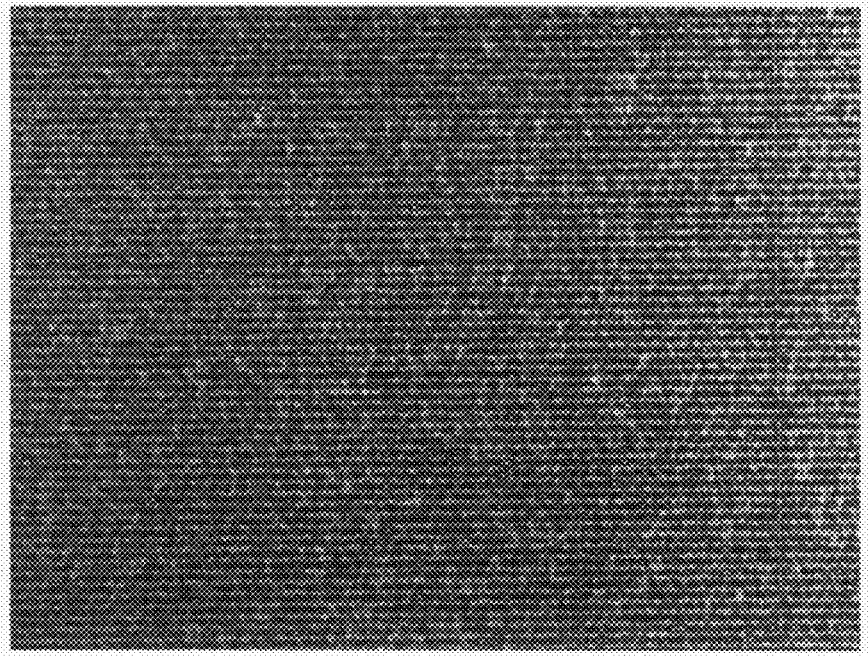

FIG. 2 shows (a) the result when a Ga-containing nitride semiconductor crystal free of a pattern is observed by an optical microscope, and (b) the result when a Ga-containing nitride semiconductor crystal having a pattern is similarly observed. FIG. 3 shows (a) the result when a Ga-containing nitride semiconductor crystal free of a pattern is observed by a fluorescence microscope, and (b) the result when a Ga-containing nitride semiconductor crystal having a pattern is similarly observed. When a pattern attributable to the artificial surface processing of the underlying substrate is present, this can be easily recognized by either device.

When a Ga-containing nitride semiconductor crystal is grown on an underlying substrate in which a striped or dot-like mask pattern is formed on the surface, defects are sometimes concentrated reflecting the pattern in the crystal. In the Ga-containing nitride semiconductor crystal of the present invention, such concentration of defects is preferably not observed at all.

Furthermore, in the Ga-containing nitride semiconductor crystal of the present invention, the fluctuation width of the dislocation density per unit area depending on the position is preferably within one digit, and it is more preferred that the dislocation density does not change depending on the position. The unit area as used herein is usually 1 cm$^2$. In other words, the ratio of maximum value to minimum value (maximum value/minimum value) of the dislocation density measured by a cathode luminescence method is preferably 10 or less.

The Ga-containing nitride semiconductor crystal and the nitride semiconductor substrate using it of the present invention each is characterized in that streaks or islands are not present inside the Ga-containing nitride semiconductor crystal constituting a substrate. The "streak" as used in the present invention means a linear defect and is not limited in the length or width. Also, the "island" as used in the present invention means an enclosed region distinguishable from others and is not particularly limited in the size or shape. When a nitride semiconductor crystal is grown on an underlying substrate in which a striped or dot-like mask pattern is formed on the surface, streaks or islands reflecting the pattern are observed in the crystal.

The presence or absence of such streaks or islands can be easily determined by a cathode luminescence (CL) method, a wet etching method, a dry etching method or a time-resolved photoluminescence (PL) method, and may also be determined by the observation through a transmission electron microscope (TEM).

The cathode luminescence method is a method of irradiating an electron beam on a crystal, observing the light emission and detecting the non-light-emitting point as a defect (see, *Journal of Crystal Growth*, 203, pp. 1-11 (1999)).

In the Ga-containing nitride semiconductor crystal of the present invention, the ratio of maximum value to minimum value (maximum value/minimum value) of the dislocation density measured by a cathode luminescence method is usually 10 or less, preferably 5 or less, more preferably 3 or less.

The wet etching method is a method of wet-etching the crystal surface and observing the defect state on the surface. For example, when a mixed solution of phosphoric acid and sulfuric acid is heated to about 200° C. and caused to wet-etch the crystal surface for about 1 hour, the portion having a crystal defect is etched and therefore, the defect state on the surface may be observed by AFM or the number of defects may be counted (see, *Solid-State Electronics*, 46, pp. 555-558 (2002)).

In place of the wet etching method, a dry etching method may also be used. For example, the temperature is set to 600° C. in an HCl gas atmosphere and gas etching of the crystal surface may be performed for about 30 minutes (see, *Applied Physics Letters*, Vol. 76, Number 23, pp. 3421-3423 (2000)). The defect state or number of defects observed is almost the same among these methods and therefore, any method may be used.

The defect state may also be observed by using a time-resolved photoluminescence method. The photoluminescence means luminescence when a semiconductor is irradiated with laser light having an energy larger than the bandgap of the semiconductor to excite an electron and the excited electron returns to the original energy level. The time-resolved photoluminescence method is a method of measuring the lifetime of the emitted light (PL lifetime) (see, *Journal of Luminescence*, 87-89, page 1196 (2000)). The lifetime of luminescence measured by this time-resolved photoluminescence method is affected by the number of defects in the crystal. That is, as revealed in Example 10 later, the PL life time is shortened when the defect density is high, and therefore, there is a substantial correlation between the defect density and the PL lifetime.

From the standpoint of decreasing the defect density, a longer PL lifetime is more preferred and the PL life time is preferably 95 ps or more, more preferably 98 ps or more, still more preferably 100 ps or more, yet still more preferably 120 ps or more, and most preferably 200 ps or more.

The Ga-containing nitride semiconductor crystal of the present invention preferably has no distribution in the reflectance and/or light scattering inside the crystal.

The reflectance may be determined, for example, by irradiating the nitride semiconductor substrate with light capable of covering the wavelength of 350 to 700 nm, setting a device capable of measuring the light intensity to the back surface of the substrate, and measuring what % of light is transmitted through the back surface based on the light irradiated on the substrate. When light at a certain wavelength is irradiated in the substrate plane as finely as possible and the difference between maximum reflectance and minimum reflectance measured is within 10%, this is judged as having no distribution in the reflectance. That is, in the Ga-containing nitride semiconductor crystal of the present invention, the maximum reflectance measured by irradiating with light at a wavelength of 450 nm is usually within 25%, preferably within 22%, more preferably within 20%. In the Ga-containing nitride semiconductor crystal of the present invention, the minimum reflectance measured by irradiating with light at a wavelength of 450 nm is usually 5% or more, preferably 10% or more, more preferably 12% or more. Also, the difference between maximum reflectance and minimum reflectance measured by irradiating with light at a wavelength of 450 nm is usually within 10%, preferably within 9%, more preferably within 8%.

In the Ga-containing nitride semiconductor crystal, striped defects may be present at intervals of 1 mm or more. The distance between striped defects is preferably 1 mm or more, more preferably 5 mm or more, still more preferably 10 mm or more. When the distance between striped defects is 1 mm or more, very refined alignment is not necessary at the production of a device and the device pattern can be registered with use of a microscope at a several fold magnification. The Ga-containing nitride semiconductor crystal preferably has no dot-like defect.

The striped or dot-like defect as used herein means a defect-concentrated region where the number of lattice defects is $10^{10}/cm^2$ or more, the length is 2 μm or more, the width is 2 μm or more and the height is 2 μm or more. The dot-like defect usually means a defect having a length of 2 to 10 μm and a width of 2 to 10 μm.

In the Ga-containing nitride semiconductor crystal, from the standpoint of crystallinity, the half-width of the X-ray rocking curve by ω scan for the (0002) plane (hereinafter referred to as a (0002)X-ray rocking curve) is usually 150 arcsec or less, preferably 120 arcsec or less, more preferably 110 arcsec or less. When the half-width of the (0002)X-ray rocking curve is 150 arcsec or less, the inclination of crystal axis, the warpage of crystal, or the like readily falls in a practical range.

The Ga-containing nitride semiconductor crystal of the present invention preferably has a size of 100 mm² or more, more preferably 200 mm² or more, still more preferably 300 mm² or more, yet still more preferably 400 mm² or more. Also, the Ga-containing nitride semiconductor crystal of the present invention preferably has a thickness of 100 μm or more, more preferably 200 μm or more, still more preferably 300 μm or more, yet still more preferably 350 μm or more.

[Production Methods of Ga-Containing Nitride Semiconductor Single Crystal and Substrate]

The method for producing the Ga-containing nitride semiconductor crystal of the present invention is not particularly limited as long as a Ga-containing nitride semiconductor crystal satisfying the conditions specified in the claims can be produced, but a preferred production method is described below.

With respect to the species of the original substrate for use in the present invention, a semiconductor or dielectric substrate may be used, but a semiconductor substrate is preferred. For example, a substrate having a lattice constant approximated to that of the Ga-containing nitride semiconductor crystal intended to grow on the original substrate is preferred, and a compound semiconductor substrate having a lattice constant of 0.30 to 0.36 nm in the a-axis direction and from 0.48 to 0.58 nm in the c-axis direction is more preferred.

Also, with respect to the species of the original substrate for use in the present invention, a compound semiconductor substrate having a bandgap energy of 2.0 to 6.5 eV is preferred. Examples of such a compound semiconductor substrate include aluminum nitride, gallium nitride, zinc oxide, indium nitride, and a compound thereof. In addition, sapphire, SiC and the like may also be used, though these have physical properties not in the above-described ranges.

Furthermore, a substrate having a crystal structure belonging to the cubic or hexagonal system is preferred. Examples of the cubic-system substrate which can be used include Si, GaAs, InGaAs, GaP, InP, ZnSe, ZnTe and CdTd, and examples of the hexagonal-system substrate which can be used include sapphire, SiC, GaN, spinel and ZnO.

As for the composition of the compound semiconductor original substrate, a substrate having a composition represented by the formula: $B_xAl_yGa_zIn_{1-x'-y'-z'}N_{s'}P_{t'}As_{1-s'-t'}$ (wherein $0 \leq x' \leq 1$, $0 \leq y' < 1$, $0 < z' \leq 1$, $0 < s' \leq 1$ and $0 \leq t' < 1$), may also be used.

Among these substrates, more preferred are a zinc oxide substrate, a sapphire substrate and a gallium nitride substrate. Those substrates may be available commercially.

The original substrate is not particularly limited in its specific shape as long as the diameter is 1 cm or more. The "diameter is 1 cm or more" as used herein means that the substrate has a size large enough to cut out a circle in a diameter of 1 cm. The shape of the substrate may not be circular and may be, for example, a rectangle with a one-side length of 1 cm or more. The diameter of the original substrate is preferably 1 cm or more, more preferably 1.5 cm or more, still more preferably 2 cm or more.

The original substrate must have a thickness large enough to allow for formation of a nitride semiconductor crystal layer thereon. The thickness of the original substrate is suitably 10 μm or more, preferably 100 μm or more, more preferably 300 μm or more, still more preferably 500 μm or more, The thickness of the original substrate is not particularly limited in its upper limit, but since removal of an excessively thick original substrate takes time, the thickness is preferably 2,000 μm or less, more preferably 1,500 μm or less, still more preferably 1,000 μm or less.

As for the original substrate, an off-substrate may also be used. For example, in the case of a sapphire substrate, a substrate where the plane on which the nitride semiconductor crystal layer is grown is an (ABCD) plane or a plane slightly inclined from the (ABCD) plane may be used. Here, A, B, C and D each represents a natural number. The angle of this slight inclination is usually from 0 to 10°, preferably from 0 to 0.5°, more preferably from 0 to 0.2°. For example, a sapphire substrate where the crystal growth plane is slightly inclined from the (0001) plane to them-axis direction is preferably used. Other than these, for example, an a (11-20) plane, an r(1-102) plane, an m(1-100) plane, a plane equivalent to such a plane, and a plane slightly inclined from such a plane may also be used. The equivalent plane as used herein means a plane which comes to have the crystallographically same atomic arrangement when rotated at 90° in the cubic system or at 60° in the hexagonal system.

At the production of the Ga-containing nitride semiconductor crystal of the present invention, the Ga-containing nitride semiconductor crystal may be grown directly on the original substrate or may be grown after forming an initial nitride semiconductor layer on the original substrate.

The initial nitride semiconductor crystal is grown by a method different from the growth method for the nitride semiconductor crystal, which is described later. Examples of the method include a molecular beam epitaxy method (MBE method), a metal-organic chemical vapor deposition method (MOCVD method), a PLD method (pulsed laser deposition; see, *J. Cryst. Growth*, 237/239, 1153 (2002)) and a hydride vapor phase epitaxy method (HVPE method). Among these, preferred are an MBE method, an MOCVD method and a PLD method, more preferred are an MBE method and an MOCVD method.

In the MBE method, despite a low growth rate, the crystal growth can be controlled with precision of a monomolecular layer level at the formation of a thin film and therefore, a layered nitride semiconductor crystal excellent in the surface property can be obtained. Also, the MBE method can grow a crystal at a relatively low temperature, so that the original substrate such as sapphire or zinc oxide can maintain the stable state without being affected by the gas used at the formation of the initial nitride semiconductor layer and/or the Ga-containing nitride semiconductor crystal layer. By forming such an initial nitride semiconductor layer, the Ga-containing nitride semiconductor crystal layer of the present invention formed on the initial nitride semiconductor layer can have a good crystal state or a good surface state and in turn, higher-quality Ga-containing nitride semiconductor crystal and substrate can be obtained.

The PLD method is advantageous when a highly reactive substrate such as sapphire or zinc oxide is used, because the crystal can be grown at a lower temperature (for example, at room temperature) and an ammonia gas is not used.

The MOCVD method and the HVPE method at present are very excellent in the mass-productivity as compared with other growth methods and are industrially advantageous. In some devices employing such a method, the number of sheets which can be grown at once exceeds 50 for a 2-inch substrate.

The thickness of the initial nitride semiconductor layer is not particularly limited as long as the Ga-containing nitride semiconductor crystal of the present invention can have stably good crystallinity or surface property. In view of productivity, the thickness is usually from 0.1 to 5.0 μm, preferably from 0.3 to 2.0 μm.

The surface roughness (Ra) of the initial nitride semiconductor layer or the original substrate is preferably 1 nm or less, more preferably 0.8 nm or less, still more preferably 0.7 nm or less. The surface roughness as used herein means a center line average roughness (Ra) and can be determined by measuring unevenness on the surface by means of AFM (atomic force microscopy).

Incidentally, in the present invention, the mutual positional relations of original substrate, initial nitride semiconductor layer and Ga-containing nitride semiconductor crystal layer are described by using an expression of "forms B on A", and this expression is used including both a case where B is formed directly on the surface of A, and a case where another layer is formed on the surface of A and B is further formed on the surface of the layer. Within the range of not impairing the effect of the present invention, another layer may be formed among the original substrate, the initial nitride semiconductor layer and the Ga-containing nitride semiconductor crystal layer.

Thereafter, the Ga-containing nitride semiconductor crystal of the present invention is formed.

The Ga-containing nitride semiconductor crystal formed is not particularly limited as long as it is a semiconductor containing Ga and nitrogen, but preferably has a composition represented by $B_xAl_yGa_zIn_{1-x-y-z}N_sP_tAs_{1-s-t}$ (wherein $0 \leq x \leq 1$, $0 \leq y < 1$, $0 < z \leq 1$, $0 < s \leq 1$ and $0 \leq t < 1$). In this formula, x is preferably $0 \leq x \leq 0.5$, more preferably $0 \leq x \leq 0.25$, y is preferably $0 \leq y \leq 0.75$, more preferably $0 \leq y \leq 0.5$, z is preferably $0.5 \leq z \leq 1$, more preferably $0.75 \leq z \leq 1$, s is preferably $0.9 \leq s \leq 1$, more preferably $0.95 \leq s \leq 1$, and t is preferably $0 \leq t \leq 0.1$, more preferably $0 \leq t \leq 0.05$.

Examples thereof include GaN and crystals represented by $In_xGa_{1-x}N$ ($0 \leq x < 1$), $Ga_xAl_{1-x}N$ ($0 < x \leq 1$), $GaN_zP_{1-z}$ ($0 < z \leq 1$) and $GaN_zAs_{1-z}$ ($0 < z \leq 1$). Among these, crystals represented by formulae $(Al_xGa_{1-x})_yIn_{1-y}N$ ($0 \leq x < 1$, $0 \leq y \leq 1$), $(Al_xGa_{1-x})_yIn_{1-y}N_zP_{1-z}$ ($0 \leq x \leq 1$, $0 \leq y \leq 1$, $0 < z \leq 1$) and $(Al_xGa_{1-x})_yIn_{1-y}N_zAs_{1-z}$ ($0 \leq x \leq 1$, $0 \leq y \leq 1$, $0 < z \leq 1$) are most preferred.

The Ga-containing nitride semiconductor crystal is a single crystal and is preferably a hexagonal crystal or a cubic crystal.

In the present invention, an initial nitride semi-conductor layer is, if desired, formed on the original substrate and the Ga-containing nitride semiconductor single crystal layer is grown thereon. Depending on the case, a nitride semiconductor crystal layer may be further grown on the Ga-containing nitride semiconductor single crystal layer. These nitride semiconductor crystal layers may be formed by epitaxially growing nitride semiconductor crystals having the same or different compositions under the same or different growth conditions but are preferably formed by epitaxially growing nitride semiconductor crystals having the same compositions.

The method for growing the Ga-containing nitride semiconductor single crystal layer of the present invention is not particularly limited and examples thereof include a molecular beam epitaxy method (MBE), a metal-organic chemical vapor deposition method (MOCVD) and a hydride vapor phase epitaxy method (HVPE). A method of directly forming the Ga-containing nitride semiconductor single crystal layer directly on the original substrate by using the hydride vapor phase epitaxy method (HVPE) is preferred. As for the epitaxial growth conditions, the conditions employed in various methods can be used. Examples of the gas used for growing the Ga-containing nitride semiconductor single crystal layer include a hydrogen halide gas such as hydrogen chloride, hydrogen fluoride, hydrogen bromide and hydrogen iodide, and an organic nitrogen compound such as ammonia, methylamine, dimethyamine, ethylamine, hydrazine, methylhydrazine and dimethylhydrazine. Particularly, in the case of growing a nitride semiconductor by using the hydride vapor phase epitaxy method (HVPE), it is preferred that the Group III raw material of the nitride semiconductor is reacted with hydrogen chloride and supplied as a Group III metal chloride (for example, $GaCl_x$, $AlCl_x$ or $InCl_x$, wherein x=1 to 3, and the value of x varies depending on the production temperature) and the nitrogen raw material is supplied as ammonia.

The case of using zinc oxide as the original substrate and forming a first nitride semiconductor crystal layer and a second nitride semiconductor crystal layer on the zinc oxide original substrate is described below. The zinc oxide original substrate can be removed after or during formation of the nitride semiconductor crystal layers.

In the case where zinc oxide is used as the original substrate, the growth temperature $T_1$ of the first nitride semiconductor is preferably lower than the growth temperature $T_2$ of the second nitride semiconductor and is preferably close to the treatment temperature $T_3$ in the step of removing the original substrate. More preferably, the growth temperature $T_1$ of the first nitride semiconductor is the same as the treatment temperature $T_3$ in the step of removing the original substrate. The first nitride semiconductor crystal layer works out to a growth starting point for growing a good second nitride semiconductor crystal layer in the subsequent step, the original substrate is sublimated and lost when a hydrogen halide gas such as hydrogen chloride, hydrogen fluoride, hydrogen bromide and hydrogen iodide, or a gas of an organic nitrogen compound such as ammonia, methylamine, dimethyamine, ethylamine, hydrazine, methylhydrazine and dimethylhydrazine (hereinafter, these are sometimes collectively referred to as a "gas used") is employed as the gas used at the formation of the nitride semiconductor and abruptly reacted by elevating the original substrate temperature to a high temperature of 1,000° C. or more, and the reaction of the gas used may readily take place even when just a part of the surface or side surface of the original substrate is exposed to the high-temperature atmosphere of the gas used. With these in mind, the upper limit of the temperature $T_1$ is preferably less than 900° C., more preferably 850° C. or less. The lower limit of the temperature $T_1$ is preferably 500° C. or more, more preferably 650° C. or more.

By setting the temperature $T_1$ to a relatively lower temperature of less than 900° C. and growing a first nitride semiconductor crystal layer to an appropriate thickness while maintaining the temperature $T_1$, the original substrate is prevented from being lost through sublimation and even in the subsequent step of removing the original substrate at a temperature $T_3$ or growing a second nitride semiconductor, the first nitride semiconductor crystal layer is not cracked, so that a good crystal state with less lattice defects can be continuously provided also in the second nitride semiconductor crystal layer. This does not apply to the case of using sapphire, SiC or nitride semiconductor as the original substrate.

The first nitride semiconductor crystal layer plays the role of a substrate for growing a second nitride semiconductor crystal layer after removal of the original substrate. In this light, the first nitride semiconductor crystal layer is suitably formed to a thickness of usually from 1 to 200 μm, preferably from 50 to 150 μm, so as to maintain the stable state at the elevation of temperature from $T_1$ to $T_2$ or during growth of the second nitride semiconductor crystal layer.

After the growth of the first nitride semiconductor crystal layer, a step of removing the peripheral portion of the first nitride semiconductor crystal layer may be further performed.

When the first nitride semiconductor crystal is formed, the first nitride semiconductor crystal sometimes grows over not only one surface but also side surface of the zinc oxide original substrate. The peripheral portion of the first nitride semiconductor crystal layer formed in this way is maintained in that state even after the step of removing the original substrate. If the second nitride semiconductor crystal is formed on the first nitride semiconductor crystal layer having such a peripheral portion, undesired crystal growth may proceed or an undesirably shaped nitride semiconductor crystal layer may be obtained. Therefore, the peripheral portion of the first nitride semiconductor crystal layer is preferably removed in advance before the second nitride semiconductor crystal layer is formed.

The method of removing the peripheral portion of the first nitride semiconductor crystal layer is not particularly limited, but examples thereof include dicing, scribing, lapping, peripheral milling and other polishing. Among these, preferred are dicing and peripheral milling.

After the formation of the first nitride semiconductor crystal layer, a step of removing the original substrate may be performed. The step of removing the original substrate is preferably performed by reacting the original substrate with the gas used at the formation of the first nitride semiconductor crystal layer. The temperature $T_3$ in the step of removing the original substrate is preferably close to the growth temperature $T_1$ of the first nitride semiconductor crystal layer. The difference between the temperature $T_3$ in the step of removing the original substrate and the growth temperature $T_1$ of the first nitride semiconductor crystal layer is preferably 100° C. or less, more preferably 50° C. or less, still more preferably 30° C. or less, yet still more preferably 0° C.

For example, the original substrate such as zinc oxide can be easily removed by keeping the gas used at the formation of the first nitride semiconductor to flow after the formation of the first nitride semiconductor crystal layer. That is, when the gas used at the formation of the first nitride semiconductor crystal layer is caused to act on the zinc oxide original substrate, a vigorous reaction occurs between the zinc oxide original substrate and the gas used and the zinc oxide original substrate is sublimated and lost, whereby the zinc oxide original substrate can be removed.

When such a removal method is employed, unlike conventional techniques, a separate step of once taking out the nitride semiconductor crystal from the reaction furnace after the growth, cooling it and then performing, for example, etching with an acid or the like, polishing or slicing by laser irradiation need not be provided and the original substrate can be easily removed in a continuous step. Furthermore, when this method of removing the original substrate is employed, the substrate is prevented from occurrence of warping or cracking caused due to difference in the thermal expansion coefficient between the original substrate and the nitride semiconductor crystal during the temperature drop to room temperature after the growth of the nitride semiconductor crystal, so that a stable nitride semiconductor crystal and a substrate using the crystal can be formed and moreover, a nitride semiconductor crystal and a substrate using the crystal can be efficiently produced in a short time without fear of breaking or cracking.

Examples of the gas used for removing the original substrate include a hydrogen halide gas such as hydrogen chloride, hydrogen fluoride, hydrogen bromide and hydrogen iodide, and a gas of an organic nitrogen compound such as ammonia, methylamine, dimethyamine, ethylamine, hydrazine, methyl-hydrazine and dimethylhydrazine. Among these, use of a hydrogen chloride gas and/or an ammonia gas is preferred and in view of low cost and safety, use of an ammonia gas is more preferred.

The original substrate may be easily separated or broken in pieces due to stress during the formation of the second nitride semiconductor crystal layer (see, Example 8). In such a case, a particular treatment for removing the original substrate need not be performed.

Also, when the first nitride semiconductor crystal layer or the second nitride semiconductor crystal layer is formed and then a laser or the like is irradiated on the interface between the original substrate and the first nitride semiconductor crystal layer to expose the interface to a high temperature, the nitrogen component of gallium nitride in particular is lost and Ga remaining in the interface can be removed by hydrochloric acid or the like, whereby the original substrate can be easily removed.

While removing the original substrate in this way or after the removal, a second nitride semiconductor crystal layer is epitaxially grown on one surface of the first nitride semiconductor crystal layer at a temperature $T_2$ to form a second nitride semiconductor crystal layer. The "while removing the original substrate" as used in the present invention means to perform the removal of the original substrate and at the same time, effect the epitaxial growth of the second nitride semiconductor crystal, that is, to epitaxially grow the second nitride semiconductor crystal on the surface opposite the original substrate side of the first nitride semiconductor crystal layer and at the same time, remove the original substrate from the original substrate side of the first nitride semiconductor crystal layer. Also, the second nitride semiconductor crystal layer may be epitaxially grown on one surface of the first nitride semiconductor crystal layer after removing the original substrate.

As for the growth method of the second nitride semiconductor crystal layer, various growth methods may be used similarly to the first nitride semiconductor crystal layer, but the HVPE method enabling high-speed growth of a nitride semiconductor is preferably used. The second nitride semiconductor crystal layer grows on the good-quality first nitride semiconductor crystal layer with less lattice defects which is grown on the original substrate and forms a thick film and therefore, good crystal state and good surface property are propagated, as a result, the defects in the crystal are more decreased and even when high-speed growth is performed, an amazingly good crystal can be maintained. Furthermore, the second nitride semiconductor crystal layer is used as a substrate for a semiconductor device and therefore, must be formed to a large thickness. It is preferred to form the second nitride semiconductor crystal to a thickness of usually from 100 µm to 50 mm, preferably from 200 µm to 15 mm, more preferably from 1 to 10 mm.

After the growth of the second nitride semiconductor crystal, a step of flowing a hydrogen chloride gas and thereby removing a nitride semiconductor crystal abnormally grown in the periphery may be further performed. At the time of forming the second nitride semiconductor crystal, a nitride semiconductor crystal sometimes grows in an undesired or unintended portion. When such a nitride semiconductor crystal is removed by flowing a hydrogen chloride gas, an objective preferred nitride semiconductor substrate can be obtained.

The flowing amount or flowing time of the hydrogen chloride gas can be appropriately determined according to the amount or the like of the abnormally grown nitride semiconductor crystal.

The surface of the second nitride semiconductor crystal layer may be subjected, if desired, to a surface treatment such as polishing. By performing a surface treatment such as polishing, it is also possible to obtain a nitride semiconductor substrate in which almost no defect is observed. However, the surface morphology of the nitride semiconductor crystal formed according to the above-described production method is in many cases a mirror surface requiring no surface polishing and therefore, polishing or the like is not essential.

On the second nitride semiconductor layer, a third nitride semiconductor crystal layer may be further formed. The step of forming the third nitride semiconductor crystal layer can be fundamentally performed in the same manner as the growth step of the second nitride semiconductor crystal layer. The third nitride semiconductor crystal may be formed on the first nitride semiconductor crystal or on the second nitride semiconductor crystal or may be formed on the first and second nitride semiconductor crystals. The growth direction of the third nitride semiconductor crystal may be the same as or different from the growth direction of the first and second nitride semiconductor crystals. For example, the third nitride semiconductor crystal may be grown in the direction nearly orthogonal to the growth direction of the first and second nitride semiconductor crystals.

The thickness of the third nitride semiconductor crystal layer is usually from 100 µm to 2 mm, preferably from 200 µm to 1 mm. In the case of growing a third nitride semiconductor crystal, the third nitride semiconductor layer may be formed to a relatively large thickness after forming the second nitride semiconductor crystal layer to a relatively small thickness.

From the same aspect, the production method of the present invention may comprise a step of forming an n-th nitride semiconductor crystal (n is 4 or more).

In addition, a step other than the above-described steps may be further performed without departing from the purport of the present invention.

The case of using sapphire as the original substrate and forming a nitride semiconductor crystal layer on an initial nitride semiconductor layer formed on the sapphire original substrate is described below.

On the sapphire original substrate, an initial nitride semiconductor layer is formed to a thickness of usually from 0.1 to 5.0 µm, preferably from 0.3 to 2.0 µm, by the MBE method, the MOCVD method, the PLD method, the HVPE method or the like.

Subsequently, a first nitride semiconductor crystal layer is formed by the MBE method, the MOCVD method, the HVPE method or the like, preferably by the HVPE method. In the case of growing the nitride semiconductor by using the HVPE method, it is preferred that the Group III raw material of the nitride semiconductor is reacted with hydrogen chloride and supplied as a Group III metal chloride (for example, $GaCl_x$, $AlCl_x$ or $InCl_x$, wherein x=1 to 3, and the value of x varies depending on the production temperature) and the nitrogen raw material is supplied as ammonia.

The reaction temperature at the time of reacting the Group III raw material with hydrogen chloride to produce a Group III metal chloride is preferably about 850° C., and the temperature at the position where the nitrogen raw material meets hydrogen chloride and the temperature at the position where the nitrogen semiconductor grows are preferably almost the same temperature and, for example, preferably about 1,050° C. The growth time varies depending on the objective film thickness but the preferred growth rate is usually from 100 to 150 µm/hour and, for example, in the case of growth to 10 mm, the growth time is approximately from 65 to 100 hours.

The first nitride semiconductor crystal layer is used as a substrate for a semiconductor device and therefore, must be formed to a large thickness. It is preferred to form the first nitride semiconductor crystal layer with a layer thickness of usually 350 µm or more, preferably 400 µm or more, more preferably 500 µm or more. The nitride semiconductor crystal layer can be film-formed up to about 10 cm and the upper limit of the layer thickness is not particularly limited but is usually 5 cm or less and depending on use, may be 20 mm or less, preferably 10 mm or less.

On the first nitride semiconductor crystal layer, a second nitride semiconductor crystal may be further formed.

The step of forming the second nitride semiconductor crystal layer can be fundamentally performed in the same manner as the growth step of the first nitride semiconductor crystal layer. The growth direction of the second nitride semiconductor crystal may be the same as or different from the growth direction of the first nitride semiconductor crystal. For example, the second nitride semiconductor crystal may be grown in the direction nearly orthogonal to the growth direction of the first nitride semiconductor crystal.

The thickness of the second nitride semiconductor crystal may be the same as the layer thickness of the above-described first nitride semiconductor crystal layer, but the second nitride semiconductor crystal may be formed to a relatively large thickness after forming the first nitride semiconductor crystal to a relatively small thickness.

From the same aspect, the production method of the present invention may comprise a step of forming an m-th nitride semiconductor crystal (m is 2 or more).

After the growth of the nitride semiconductor crystal, a step of flowing a hydrogen chloride gas and thereby removing a nitride semiconductor crystal abnormally grown in the periphery may be further performed. At the time of forming the nitride semiconductor crystal, a nitride semiconductor crystal sometimes grows in an undesired or unintended portion. When such a nitride semiconductor crystal is removed by flowing a hydrogen chloride gas, an objective preferred nitride semiconductor substrate can be obtained. The flowing amount or flowing time of the hydrogen chloride gas can be appropriately determined according to the amount or the like of the abnormally grown nitride semiconductor crystal.

The surface of the nitride semiconductor crystal layer may be subjected, if desired, to a surface treatment such as polishing. By performing a surface treatment such as polishing, it is also possible to obtain a nitride semiconductor substrate in which almost no defect is observed. However, the surface morphology of the nitride semiconductor crystal formed according to the above-described production method is in many cases a mirror surface requiring no surface polishing and therefore, polishing or the like is not essential.

In addition, a step other than the above-described steps may be further performed without departing from the purport of the present invention.

The sapphire original substrate may be easily separated or broken in pieces due to stress during the formation of the first, second or other nitride semiconductor crystal layer (see, Example 8). In such a case, a particular treatment for removing the original substrate need not be performed.

Also, when the first nitride semiconductor crystal layer or the second nitride semiconductor crystal layer is formed and then a laser is irradiated on the interface between the original substrate and the first nitride semiconductor crystal layer to expose the interface to a high temperature, the nitrogen component of gallium nitride in particular is lost and Ga remaining in the interface can be removed by hydrochloric acid or the like, whereby the original substrate can be easily removed.

In the present invention, on the original substrate, a nitride semiconductor crystal layer is usually stacked to a thickness of 350 μm or more. In the case of growing the nitride semiconductor layer by the HVPE method, the Group III raw material of the nitride semiconductor is reacted with hydrogen chloride and supplied as a Group III metal chloride (for example, $GaCl_x$, $AlCl_x$ or $InCl_x$, wherein x=1 to 3, and the value of x varies depending on the production temperature) and the nitrogen raw material is supplied as ammonia. At this time, ammonium chloride ($NH_4Cl$) is produced as a by-product of the reaction. The temperature in the HVPE reactor during the crystal growth is high (about 900° C. to 1,100° C.) and therefore, the ammonium chloride is in a gas state and usually removed from the reactor together with other gases (e.g., raw material gas, gas produced by the reaction). In the production method of the present invention, the temperature of the ammonium chloride when discharged from the reactor is preferably kept at 400° C. or more, for example, the temperature of the ammonium chloride-containing gas is preferably kept at 400° C. or more. More specifically, for example, the temperature of the ammonium chloride-containing gas present in the HVPE reactor or in the pipeline pulled out from the HVPE reactor is preferably kept at 400° C. or more. By keeping the temperature in this way, clogging of the pipeline from the HVPE reactor can be prevented and a long time can be allowed until clogging occurs, so that the nitride semiconductor crystal layer can be stacked to a larger thickness than ever before. With respect to the means for keeping the temperature of the ammonium chloride-containing gas at 400° C. or more, for example, a technique of attaching keep-warm equipment or thermally insulating equipment to the pipeline pulled out from the HVPE reactor or a technique of heating the pipeline by a heater may be employed.

[Application of Ga-Containing Nitride Semiconductor Single Crystal]

The Ga-containing nitride semiconductor single crystal of the present invention may be used as-is as a substrate for a semiconductor device or may be used as a substrate for a semiconductor device after further stacking a layer or being loaded on a material body. The Ga-containing nitride semiconductor single crystal of the present invention has less crystal defects and good crystallinity and therefore, is suitably used for a semiconductor device or the like such as light-emitting device, particularly, blue or white light-emitting device (e.g., light-emitting diode, semiconductor laser), chip or module using the light-emitting device, and electronic device.

The present invention is described in greater detail below by referring to Examples and Comparative Examples. The materials, amounts used, ratios, treatment contents, treatment procedure and the like described in the following Examples can be appropriately changed or modified without departing from the purport of the present invention. Accordingly, the scope of the present invention should not be construed as being limited to these specific examples.

EXAMPLE 1

Example 1 is described based on FIG. 1.

A square zinc oxide original substrate 101 having a thickness of 500 μm and a one-side length of 2 cm with the surface comprising a (0001) plane was prepared and washed with an organic solvent in advance to effect a pretreatment. The zinc oxide original substrate 101 was then set in an HVPE apparatus (reactor) and after elevating the temperature to 850° C., GaCl as a reaction product of Ga and HCl, and an $NH_3$ gas (hereinafter these are referred to as "raw material gases") were simultaneously introduced and the epitaxial growth was allowed to proceed for about 2 hours to deposit a first GaN layer 102 to a thickness of about 60 μm, whereby an underlying layer 103 was formed.

Subsequently, while keeping the underlying layer 103 at that temperature, an $NH_3$ gas was flowed at a partial pressure of about 10% to cause the zinc oxide original substrate 101 to react with the $NH_3$ gas and disappear through sublimation.

After once lowering the temperature, the underlying layer 103 deprived of the zinc oxide original substrate 101 was taken out from the HVPE apparatus, rendered flat by removing the GaN crystal intruded into the periphery by dicing as shown in FIG. 1(*c*), and again placed in the HVPE apparatus. The temperature was elevated to 1,050° C., the raw material gases were introduced on the remaining first GaN layer 102, and the epitaxial growth was allowed to proceed for about 10 hours to form a second GaN layer 104 to a thickness of about 1 mm, whereby a GaN single crystal 105 was obtained.

The GaN single crystal obtained after the growth was observed by an optical microscope and a fluorescence microscope and found to be homogeneous throughout the surface as shown in FIG. 2(*a*) and FIG. 3(*a*). That is, a pattern attributable to the artificial surface processing of the underlying substrate as seen in FIG. 2(*b*) and FIG. 3(*b*) (a conventional product obtained, for example, in "Examples 1 to 3 of JP-A-11-251253") was not observed. Here, FIG. 2 is a photograph obtained by taking a differential interference image, and FIG. 3 is a photograph obtained by irradiating with light of a mercury lamp on the sample and photographing light emitted from the sample. The photograph is at a 50-fold magnification in FIG. 2 and at a 50-fold magnification in FIG. 3.

It was verified from these that the GaN single crystal obtained in Example 1 was homogenous and had no distribution in the reflectance and no distribution in the light scattering. Also, in the GaN single crystal obtained in Example 1, unlike a GaN single crystal obtained by a conventional method, a state of defects being concentrated was not observed.

In the obtained GaN single crystal, the maximum reflectance measured by irradiating with light at a wavelength of 450 nm was 18.97%, the minimum reflectance was 15.94%, and the difference therebetween was within 10%. The reflectance measuring apparatus (UV-3100P, manufactured by SHIMADZU) used employs a system such that a halogen lamp is used as the light source and by irradiating with the spectrally dispersed light at an angle of 5° with respect to the normal direction of the sample, the reflected light is measured. The reflectance is a ratio of reflected light to incident light.

Furthermore, a defect-concentrated region was not present in the crystal.

EXAMPLE 2

A square zinc oxide original substrate having a thickness of 500 μm and a one-side length of 2 cm with the surface comprising a (1-100) plane was prepared and washed with an organic solvent in advance to effect a pretreatment. The zinc oxide original substrate was then set in an HVPE apparatus and after elevating the temperature to 850° C., the raw material gases were introduced and the epitaxial growth was allowed to proceed for about 2 hours to deposit a first GaN layer to a thickness of about 60 μm, whereby an underlying layer was formed.

Subsequently, while keeping the underlying layer at that temperature, an $NH_3$ gas was flowed at a partial pressure of about 10% to cause the zinc oxide original substrate to react with the $NH_3$ gas and disappear through sublimation.

Thereafter, the temperature was elevated to 1,050° C., the raw material gases were introduced on the first GaN layer, and the epitaxial growth was allowed to proceed for about 10 hours to form a second GaN layer to a thickness of about 1 mm, whereby a GaN single crystal was obtained. The surface morphology of the obtained GaN single crystal was a mirror surface requiring no surface polishing. Also, the obtained GaN single crystal was homogeneous by virtue of the absence of an artificial processing pattern attributable to the underlying substrate and was free of defects and highly transparent.

In the obtained GaN single crystal, the maximum reflectance measured by irradiating with light at a wavelength of 450 nm was 19%, the minimum reflectance was 16%, and the difference therebetween was within 10%.

Furthermore, a defect-concentrated region was not present in the crystal.

EXAMPLE 3

A square zinc oxide original substrate having a thickness of 500 μm and a one-side length of 2 cm with the surface comprising a (11-20) plane was prepared and washed with an organic solvent in advance to effect a pretreatment. The zinc oxide original substrate was then set in an HVPE apparatus and after elevating the temperature to 850° C., the raw material gases were introduced and the epitaxial growth was allowed to proceed for about 2 hours to deposit a first GaN layer to a thickness of about 60 μm, whereby an underlying layer was formed.

Subsequently, while keeping the underlying layer at that temperature, an $NH_3$ gas was flowed at a partial pressure of about 10% to cause the zinc oxide original substrate to react with the $NH_3$ gas and disappear through sublimation.

Thereafter, the temperature was elevated to 1,050° C., the raw material gases were introduced on the first GaN layer, and the epitaxial growth was allowed to proceed for about 10 hours to form a second GaN layer to a thickness of about 1 mm, whereby a GaN single crystal was obtained. The surface morphology of the obtained GaN single crystal was different from that of Example 2 and the grown surface was in a state that facets of a plane equivalent to the (1-100) plane were markedly observed. When the (11-20) plane was then surface-polished to a mirror finish, the obtained GaN single crystal was homogeneous by virtue of the absence of an artificial processing pattern attributable to the underlying substrate and was free of defects and highly transparent.

Also, in the obtained GaN single crystal, the maximum reflectance measured by irradiating with light at a wavelength of 450 nm was 18.5%, the minimum reflectance was 15.7%, and the difference therebetween was within 10%.

Furthermore, a defect-concentrated region was not present in the crystal.

EXAMPLE 4

A GaN single crystal was obtained by performing the same steps as in Example 1 except that a substrate having surface inclined twice to the <1-100> direction from the (0001) plane was used in place of the zinc oxide substrate having a surface comprising a (0001) plane. By the effect of step flow growth in the m-axis direction, the surface morphology was more improved.

The same improvement of surface morphology was observed also in the case of using a substrate having a surface inclined to the <1-100> direction from the (11-20) plane. The obtained GaN single crystal was homogeneous by virtue of the absence of an artificial processing pattern attributable to the underlying substrate and was free of defects and transparent.

Also, in the obtained GaN single crystal, the maximum reflectance measured by irradiating with light at a wavelength of 450 nm was 18.0%, the minimum reflectance was 15.0%, and the difference therebetween was within 10%.

Furthermore, a defect-concentrated region was not present in the crystal.

EXAMPLE 5

A square zinc oxide original substrate having a thickness of 500 μm and a one-side length of 2 cm with the surface comprising a (0001) plane was prepared and washed with an organic solvent in advance to effect a pretreatment, and then an initial GaN layer 106 of 0.4 μm was grown by an MBE apparatus. This sample was set in an HVPE apparatus and after elevating the temperature to 850° C., the raw material gases were introduced and the epitaxial growth was allowed to proceed for about 2 hours to deposit a first GaN layer 102 to a thickness of about 60 μm, whereby an underlying layer was formed.

Subsequently, while keeping the underlying layer at that temperature, an $NH_3$ gas was flowed at a partial pressure of about 10% to cause the zinc oxide original substrate to react with the $NH_3$ gas and disappear through sublimation.

Thereafter, the temperature was elevated to 1,050° C., the raw material gases were introduced on the first GaN layer 102, and the epitaxial growth was allowed to proceed for about 10 hours to form a second GaN layer 104 to a thickness of about 1 mm, whereby a GaN single crystal was obtained.

The obtained GaN single crystal was homogeneous by virtue of the absence of an artificial processing pattern attributable to the underlying substrate and was free of defects and highly transparent.

Furthermore, a defect-concentrated region was not present in the crystal.

EXAMPLE 6

A square zinc oxide original substrate having a thickness of 500 μm and a one-side length of 2 cm with the surface comprising a (0001) plane was prepared and washed with an organic solvent in advance to effect a pretreatment, and then an initial GaN layer of 0.4 μm was grown by an MBE apparatus. This sample was set in an HVPE apparatus and after elevating the temperature to 1,050° C., the raw material gases were introduced and the epitaxial growth was allowed to proceed for about 2 hours to deposit a first GaN layer to a thickness of about 60 μm, whereby an underlying layer was formed.

Subsequently, while keeping the underlying layer at that temperature, an $NH_3$ gas was flowed at a partial pressure of about 10% to cause the zinc oxide original substrate to react with the $NH_3$ gas and disappear through sublimation.

Thereafter, the temperature was kept at 1,050° C., the raw material gases were introduced on the first GaN layer, and the epitaxial growth was allowed to proceed for about 10 hours to form a second GaN layer to a thickness of about 1 mm, whereby a GaN single crystal was obtained.

The obtained GaN single crystal was homogeneous by virtue of the absence of an artificial processing pattern attributable to the underlying substrate and was free of defects and highly transparent.

Furthermore, a defect-concentrated region was not present in the crystal.

EXAMPLE 7

A square zinc oxide original substrate having a thickness of 500 μm and a one-side length of 2 cm with the surface comprising a (0001) plane was prepared and washed with an organic solvent in advance to effect a pretreatment, and then an initial GaN layer of 0.4 μm was grown by an MBE apparatus. This sample was set in an HVPE apparatus and after elevating the temperature to 1,050° C., the raw material gases were introduced and the epitaxial growth was allowed to proceed for about 10 hours to deposit a first GaN layer to a thickness of about 1 mm, whereby a GaN single crystal was obtained. The underlying zinc oxide substrate was spontaneously lost during the growth of the GaN single crystal.

The obtained GaN single crystal was homogeneous by virtue of the absence of an artificial processing pattern attributable to the underlying substrate and was free of defects and highly transparent.

Also, in the obtained GaN single crystal, the maximum reflectance measured by irradiating with light at a wavelength of 450 nm was 18.7%, the minimum reflectance was 15.7%, and the difference therebetween was within 10%.

Furthermore, a defect-concentrated region was not present in the crystal.

EXAMPLE 8

A sapphire substrate having a thickness of 430 μm and a diameter of 2 inch with the surface comprising a (0001) plane was prepared and washed with an organic solvent in advance to effect a pretreatment, and then an initial GaN layer of 2 μm was grown by an MOCVD apparatus. This sample was set in an HVPE apparatus and after elevating the temperature to 1,050° C., the raw material gases were introduced on the initial GaN layer and the epitaxial growth was allowed to proceed for about 24 hours to form a GaN layer to a thickness of 2.5 mm. The sapphire substrate after the growth was broken in pieces due to stress with the GaN layer and a GaN single crystal independent of the sapphire substrate could be easily obtained. The obtained GaN single crystal was homogeneous by virtue of the absence of an artificial processing pattern attributable to the underlying substrate and was free of defects and highly transparent. The half-width of the (0002) X-ray rocking curve of the obtained GaN single crystal was measured and found to be 80 arcsec.

Also, in the obtained GaN single crystal, the maximum reflectance measured by irradiating with light at a wavelength of 450 nm was 18.9%, the minimum reflectance was 15.9%, and the difference therebetween was within 10%.

The maximum value of the dislocation density on the crystal surface measured by a cathode luminescence (CL) method was $2.0 \times 10^7$ $cm^{-2}$, the minimum value was $8.8 \times 10^6$ $cm^{-2}$, and the ratio therebetween (maximum value/minimum value) was 2.3.

The apparatus used for the cathode luminescence observation was MONOCL3+ manufactured by Gatan UK and the measurement was performed at an accelerating voltage of 10 kV. Also, the portion where the dislocation density by the CL method was $8.8 \times 10^6$ $cm^{-2}$ was observed by TEM (apparatus used: TECNAI G2 F20 manufactured by FEI, accelerating voltage: 200 kV), as a result, the dislocation density was $8.6 \times 10^6$ $cm^{-1}$.

Furthermore, a defect-concentrated region was not present in the crystal.

EXAMPLE 9

A sapphire substrate having a thickness of 430 μm and a diameter of 2 inch with the surface comprising a (0001) plane was prepared and washed with an organic solvent in advance to effect a pretreatment, and then growth was allowed to proceed at 1,050° C. for 1 hour in an HVPE apparatus to grow an initial GaN layer of 5 μm. The surface roughness (Ra) of the initial GaN film was 0.7 nm. Subsequently, the raw material gases were introduced on the initial GaN layer and the epitaxial growth was allowed to proceed for about 24 hours to form a GaN layer to a thickness of 2.5 mm. After the growth, a GaN single crystal could be easily obtained similarly to Example 8. The obtained GaN single crystal was homogeneous by virtue of the absence of an artificial processing pattern attributable to the underlying substrate and was carrying very small defects and highly transparent. The half-width of the (0002)X-ray rocking curve of the obtained GaN single crystal was measured and found to be 100 arcsec.

Also, in the obtained GaN single crystal, the maximum reflectance measured by irradiating with light at a wavelength of 450 nm was 18.9%, the minimum reflectance was 15.9%, and the difference therebetween was within 10%.

The lifetime measured by a time-resolved photo-luminescence method was 200 ps.

Furthermore, a defect-concentrated region was not present in the crystal.

EXAMPLE 10

A sapphire substrate having a thickness of 430 μm and a diameter of 2 inch with the surface comprising a (0001) plane was prepared and washed with an organic solvent in advance to effect a pretreatment, and then an initial GaN layer of 2 μm was grown by an MOCVD apparatus (Sample A). This sample was set in an HVPE apparatus and after elevating the temperature to 1,050° C., the raw material gases were introduced on the initial GaN layer and the epitaxial growth was allowed to proceed for about 5 hours to form a GaN layer to a thickness of 0.5 mm, whereby a GaN single crystal was obtained (Sample B).

The obtained GaN single crystal was homogeneous by virtue of the absence of an artificial processing pattern attributable to the underlying substrate and was carrying small defects and highly transparent. The surfaces of both Sample A and Sample B were subjected to time-resolved photoluminescence (TRPL) measurement at room temperature. The time-resolved photoluminescence measurement conditions were as follows.

Excitation wavelength: 294 nm
Pulse width: 250 fs
Repetition: 76 MHz
Excitation intensity: 15 nJ/cm$^{-2}$
Spot diameter: up to 100 μm In the measurement results, the PL lifetime of Sample A was 90 ps and that of Sample B was 400 ps.

Also, the defect density of each sample was measured by the cathode luminescence (CL) method and found to be 3.5×10$^8$ cm$^{-2}$ in Sample A and 1.7×10$^7$ cm$^{-2}$ in Sample B.

In the obtained GaN single crystal, the maximum reflectance measured by irradiating with light at a wavelength of 450 nm was 19.2%, the minimum reflectance was 16.1%, and the difference therebetween was within 10%.

The maximum value of the dislocation density measured in the vicinity of center of the GaN single crystal by the cathode luminescence method was 1.7×10$^{-7}$ cm$^{-2}$ and the minimum value was 1.5×10$^{-7}$ cm$^{-2}$.

Furthermore, a defect-concentrated region was not present in the crystal.

EXAMPLE 11

A zinc oxide original substrate having a thickness of 500 μm and a diameter of 2 cm with the surface comprising a (0001) plane was prepared and washed with an organic solvent in advance to effect a pretreatment. The zinc oxide original substrate was then set in an HVPE apparatus and after elevating the temperature to 850° C., GaCl as a reaction product of Ga and HCl, as the Group 5 gas, an NH$_3$ gas and PH$_3$ (phosphine) were simultaneously introduced and the epitaxial growth was allowed to proceed for about 2 hours to deposit a GaNP layer to a thickness of about 60 μm, whereby an underlying layer was formed. The flow rates of NH$_3$ and PH$_3$ each was adjusted so that the zinc oxide original plate and the GaNP layer could be lattice-matched.

Subsequently, while keeping the underlying layer at that temperature, an NH$_3$ gas was flowed at a partial pressure of about 10% to cause the zinc oxide original substrate to react with the NH$_3$ gas and disappear through sublimation.

After once lowering the temperature, the underlying layer deprived of the zinc oxide original substrate was taken out from the HVPE furnace, rendered flat by removing the GaNP crystal intruded into the periphery by dicing, and again placed in the HVPE apparatus. The temperature was elevated to 1,050° C. and by simultaneously introducing GaCl as a reaction product of Ga and HCl, as the Group 5 gas, an NH$_3$ gas and PH$_3$ (phosphine) on the remaining GaNP layer, the epitaxial growth was allowed to proceed for about 10 hours to form a second GaNP layer to a thickness of about 1 mm, whereby a GaN single crystal was obtained. The obtained GaN single crystal was observed by an optical microscope and a fluorescence microscope and found to be homogeneous throughout the surface.

Also, in the obtained GaNP single crystal, the maximum reflectance measured by irradiating with light at a wavelength of 450 nm was 16.5%, the minimum reflectance was 15%, and the difference therebetween was within 10%. Furthermore, a defect-concentrated region was not present similarly to those crystals produced above.

In Examples 1 to 11, the temperature of the ammonium chloride-containing gas withdrawn from the reactor was kept at 400° C. or more by heating the pipeline pulled out from the HVPE reactor by means of a heater. As a result, even the reactor was continuously operated for 50 hours, the pipeline with a diameter of 50 mm was not clogged.

Comparative Example

A square zinc oxide original substrate having a thickness of 500 μm and a one-side length of 2 cm with the surface comprising a (0001) plane was prepared and washed with an organic solvent in advance to effect a pretreatment. The zinc oxide original substrate was then set in an HVPE apparatus and after elevating the substrate temperature to 650° C., the raw material gases were simultaneously introduced into the HVPE apparatus and the epitaxial growth was allowed to proceed for about 2 hours to deposit a first GaN layer to a thickness of about 60 μm, whereby an underlying layer was formed.

Subsequently, the setting of substrate temperature was kept as-is to 650° and an NH$_3$ gas was flowed at a partial pressure of about 10% to cause the zinc oxide original substrate to react with the NH$_3$ gas, but the original substrate was not lost through sublimation.

Thereafter, the substrate temperature was elevated to 1,050° C., the raw material gases were introduced on the first GaN layer, and the epitaxial growth was allowed to proceed for about 10 hours to form a second GaN layer to a thickness of about 1 mm. In the obtained GaN single crystal, cracks were generated due to difference of the thermal expansion coefficient from the original substrate and the transparency was bad.

INDUSTRIAL APPLICABILITY

The Ga-containing nitride semiconductor single crystal of the present invention is free from a pattern or defect attributable to the artificial surface processing of the underlying substrate and therefore, when used as a substrate for a semiconductor device, need not be cut out selecting a region which avoids the pattern or defect, so that time-consuming process on use can be dispensed with and the production time and cost can be reduced. Also, the Ga-containing semiconductor single crystal of the present invention is a high-quality crystal with less crystal defects and therefore, can be effectively used as a high-performance substrate in various application fields. In particular, the Ga-containing nitride semiconductor single crystal of the present invention is suitably used for a semiconductor device or the like such as light-emitting device, especially, blue or white light-emitting device (e.g., light-emitting diode, semiconductor laser), chip or module using the light-emitting device, and electronic device. These applied products can be easily produced and assure high quality as compared with the case of using a conventional nitride semiconductor substrate and therefore, the industrial applicability of the present invention is high.

While the invention has been described in detail and with reference to specific embodiments thereof, it will be apparent to one skilled in the art that various changes and modifications can be made therein without departing from the spirit and scope of the invention. This application is based on Japanese Patent Application No. 2004-230212, filed Aug. 6, 2004, and Japanese Patent Application No. 2005-084907, filed Mar. 23, 2005, the entire contents of which are incorporated herein by reference.

The invention claimed is:

1. A method for producing a Ga-containing nitride semiconductor single crystal, comprising:

providing an original substrate which is a compound semiconductor single crystal comprising zinc oxide and has a lattice constant of from 0.30 to 0.36 nm in the a-axis direction and from 0.48 to 0.58 nm in the c-axis direction;

forming an initial nitride semiconductor layer on the original substrate;

growing on the initial nitride semiconductor layer a Ga-containing nitride semiconductor single crystal having a composition represented by a formula, $B_x Al_y Ga_z In_{1-x-y-z} N_s P_t As_{1-s-t}$, where $0 \leq x \leq 1$, $0 \leq y < 1$, $0 < z \leq 1$, $0 < s \leq 1$ and $0 \leq t < 1$, the growing comprising growing a first Ga-containing nitride semiconductor single crystal layer on the initial nitride semiconductor layer at a first temperature, $T_1$, and growing a second Ga-containing nitride semiconductor single crystal layer on the first Ga-containing nitride semiconductor single crystal at a second temperature; and removing the original substrate substantially in entirety, after forming the first Ga-containing nitride semiconductor single crystal layer and before forming the second Ga-containing nitride semiconductor single crystal layer, at a third temperature, $T_3$, satisfying $0° C. \leq |T_1 - T_3| \leq 100° C.$, wherein the composition of the Ga-containing nitride semiconductor single crystal satisfies at least one of: the maximum reflectance measured by irradiating the Ga-containing nitride semiconductor single crystal with light at a wavelength of 450 nm is 20% or less and the difference between the maximum reflectance and the minimum reflectance is within 10%;

the ratio of maximum value to minimum value of the dislocation density measured by a cathode luminescence method is 10 or less; and the lifetime measured by a time-resolved photo-luminescence method is 95 ps or more.

2. The method for producing a Ga-containing nitride semiconductor single crystal as claimed in claim 1, wherein the bandgap energy of the original substrate is from 2.0 to 6.5 eV.

3. The method for producing a Ga-containing nitride semiconductor single crystal as claimed in claim 1, wherein the thickness of the initial nitride semiconductor layer is from 0.1 to 5.0 μm.

4. The method for producing a Ga-containing nitride semiconductor single crystal as claimed in claim 1, wherein the initial nitride semiconductor layer is gallium nitride.

5. The method for producing a Ga-containing nitride semiconductor single crystal as claimed in claim 1, wherein the surface roughness Ra of at least one of the original substrate and the initial nitride semiconductor layer formed on the original substrate is 1 nm or less.

6. The method for producing a Ga-containing nitride semiconductor single crystal as claimed in claim 1, wherein the Ga-containing nitride semiconductor single crystal is grown by the hydride vapor phase epitaxy method.

7. The method for producing a Ga-containing nitride semiconductor single crystal as claimed in claim 1, further comprising keeping at a temperature of 400° C. or more a gas produced as a by-product during the growing of the Ga-containing nitride semiconductor single crystal, wherein the gas comprises ammonium chloride.

8. The method for producing a Ga-containing nitride semiconductor single crystal as claimed in claim 1, wherein the first temperature is lower than the second temperature.

9. The method for producing a Ga-containing nitride semiconductor single crystal as claimed in claim 1, wherein the first temperature is the same as the third temperature.

* * * * *